(12) United States Patent
Xiong et al.

(10) Patent No.: US 9,972,964 B2
(45) Date of Patent: May 15, 2018

(54) POLARIZATION-BASED DUAL CHANNEL WAVELENGTH LOCKER

(71) Applicant: Lumentum Operations LLC, Milpitas, CA (US)

(72) Inventors: Wei Xiong, Shenzhen (CN); Michael C. Larson, Oakland, CA (US); Zhaoming Li, Shenzhen (CN)

(73) Assignee: Lumentum Operations LLC, Milpitas, CA (US)

( * ) Notice: Subject to any disclaimer, the term of this patent is extended or adjusted under 35 U.S.C. 154(b) by 0 days. days.

(21) Appl. No.: 15/132,944

(22) Filed: Apr. 19, 2016

(65) Prior Publication Data

US 2017/0302052 A1 Oct. 19, 2017

(51) Int. Cl.
| | |
|---|---|
| *H04B 10/50* | (2013.01) |
| *H01S 3/13* | (2006.01) |
| *H01S 3/00* | (2006.01) |
| *G02B 27/28* | (2006.01) |
| *G02B 5/30* | (2006.01) |

(Continued)

(52) U.S. Cl.
CPC .......... *H01S 3/1305* (2013.01); *G02B 5/3083* (2013.01); *G02B 27/283* (2013.01); *G02F 1/21* (2013.01); *H01S 3/0064* (2013.01); *H01S 3/0078* (2013.01); *H01S 3/0085* (2013.01); *H01S 3/23* (2013.01); *G02F 2001/213* (2013.01); *G02F 2001/215* (2013.01)

(58) Field of Classification Search
CPC .......................... H04B 10/503; H04B 10/5053; G02B 27/106; G02B 27/283
USPC ........................................ 250/205; 372/50.12
See application file for complete search history.

(56) References Cited

U.S. PATENT DOCUMENTS

| | | |
|---|---|---|
| 5,798,859 A | 8/1998 | Colbourne |
| 6,178,002 B1 | 1/2001 | Mueller-Wirts |
| 6,366,592 B1 | 4/2002 | Flanders |

(Continued)

FOREIGN PATENT DOCUMENTS

WO WO 2011/023765 3/2011

OTHER PUBLICATIONS

Co-pending U.S. Appl. No. 15/132,797, filed Apr. 19, 2016 entitled "Wavelength Locker Using Multiple Feedback Curves to Wavelength Lock a Beam," Xiong et al., 56 pages.

(Continued)

*Primary Examiner* — Kevin Pyo
(74) *Attorney, Agent, or Firm* — Harrity & Harrity, LLP

(57) ABSTRACT

An optical device may include a laser emitter to generate a first laser beam and a second laser beam with orthogonal polarization states. The optical device may include first and second photodetectors to generate respective first currents based on optical powers of the first and second laser beams. The optical device may include a polarization-based beam splitter to combine the first and second laser beams. The optical device may include a wavelength filter to filter the first and second laser beams based on respective wavelengths of the first and second laser beams. The optical device may include a third photodetector and a fourth photodetector to generate respective second currents based on optical powers of the first and second laser beams after filtration. The wavelengths of the first and second laser beams may be controlled based on the first currents and the second currents.

20 Claims, 6 Drawing Sheets

(51) Int. Cl.
*H01S 3/23* (2006.01)
*G02F 1/21* (2006.01)

(56) References Cited

U.S. PATENT DOCUMENTS

| | | |
|---|---|---|
| 6,526,071 B1 | 2/2003 | Zorabedian et al. |
| 6,549,548 B2 | 4/2003 | Kuznetsov et al. |
| 6,560,252 B1 | 5/2003 | Colbourne |
| 6,714,566 B1 | 3/2004 | Coldren et al. |
| 6,822,979 B2 | 11/2004 | Daiber |
| 7,095,776 B2 | 8/2006 | Kuznetsov et al. |
| 7,120,176 B2 | 10/2006 | McDonald et al. |
| 7,397,571 B2 | 7/2008 | Krneta et al. |
| 7,420,686 B2 | 9/2008 | Tan |
| 7,573,919 B2 | 8/2009 | Cattelan et al. |
| 7,633,624 B1 | 12/2009 | Wickholm |
| 8,179,930 B2 | 5/2012 | Musio et al. |
| 8,254,418 B2 | 8/2012 | Smith et al. |
| 8,311,067 B2 | 11/2012 | Ensher et al. |
| 9,395,504 B2 | 7/2016 | Uesaka et al. |
| 2003/0072542 A1 | 4/2003 | Furuichi |
| 2005/0018995 A1 | 1/2005 | Chang |
| 2011/0032529 A1 | 2/2011 | Wan et al. |
| 2011/0052207 A1 | 3/2011 | Ishikawa |
| 2012/0025714 A1 | 2/2012 | Downing, Jr. et al. |
| 2015/0318951 A1* | 11/2015 | Zhang .................... G02B 27/28 398/65 |

OTHER PUBLICATIONS

P. Wang et al., "Passive photonic integrated ratiometric wavelength monitor with resolution better than 15pm", Optics Express vol. 25, Feb. 3, 2017, 11 pages.

* cited by examiner

POLARIZATION-BASED DUAL CHANNEL WAVELENGTH LOCKER

TECHNICAL FIELD

The present disclosure relates to laser systems and methods of operating laser systems. More particularly, the present disclosure relates to methods and systems for performing wavelength locking of two laser emitters (e.g., a dual laser emitter that emits two lasers or a pair of laser emitters that each emit one laser) in a laser system.

BACKGROUND

An optical device, such as a transmitter optical subassembly (TOSA), a transmitter/receiver optical subassembly (TROSA), or the like, may convert electrical signals into optical signals to transmit information to another device, such as a receiver optical subassembly (ROSA), another TROSA, or the like. In some cases, the optical signals are generated based on laser beams having particular target wavelengths/frequencies. For example, in a dense wavelength division multiplexing (DWDM) application, the optical signals may be generated to conform to frequencies identified by the International Telecommunication Union (ITU) ITU-C DWDM G.694.1 grid specification. By generating the optical signals at particular frequencies, the optical device simplifies multiplexing and demultiplexing of the optical signals and reduces interference and crosstalk between optical signals with similar wavelengths.

SUMMARY

An optical device may include a dual laser emitter to generate a first laser beam and a second laser beam. The first laser beam and the second laser beam may be associated with orthogonal polarization states. The optical device may include a first photodetector and a second photodetector to generate respective first currents based on optical powers of the first laser beam and the second laser beam. The first currents may be used to control the wavelengths at which the first laser beam and the second laser beam are to be generated. The optical device may include a polarization-based beam splitter to combine the first laser beam and the second laser beam based on the orthogonal polarization states. The optical device may include a wavelength filter to filter the first laser beam and the second laser beam based on respective wavelengths of the first laser beam and the second laser beam. The optical device may include a third photodetector and a fourth photodetector to generate respective second currents. The third photodetector and the fourth photodetector may generate the respective second currents based on optical powers of the first laser beam and the second laser beam after the first laser beam and the second laser beam are filtered by the wavelength filter. The wavelengths of the first laser beam and the second laser beam may be controlled based on the first currents and the second currents.

A method may include receiving or generating a first laser beam and a second laser beam at orthogonal polarization states. The method may include determining respective reference values for respective first portions of the first laser beam and the second laser beam. The reference values may be determined based on respective optical powers of the first portions. The method may include combining second portions of the first laser beam and the second laser beam to form a third laser beam. The method may include wavelength filtering the third laser beam to form a filtered laser beam. The filtered laser beam may include filtered second portions of the first laser beam and the second laser beam, respectively. The method may include determining respective transmission values of the first laser beam and the second laser beam based on respective optical powers of the filtered second portions. The method may include controlling wavelengths of the first laser beam and the second laser beam based on the reference values and the transmission values.

An optical device may include a dual laser emitter to generate a first laser beam and a second laser beam. The optical device may include first and second photodetectors to generate respective reference values based on respective optical powers of the first laser beam and the second laser beam. The first photodetector may generate the reference value for a first portion of the first laser beam, and the second photodetector may generate the reference value for a first portion of the second laser beam. The optical device may include a polarization-based beam splitter to combine the first laser beam and the second laser beam into a combined laser beam based on the first laser beam and the second laser beam having different polarization states. The optical device may include a wavelength filter to filter at least a portion of the combined laser beam based on wavelengths of the first laser beam and the second laser beam to form a filtered laser beam. The optical device may include third and fourth photodetectors to generate transmission values based on respective optical powers of respective second portions of the first laser beam and the second laser beam after the filtered laser beam is formed. The third photodetector may generate the transmission value for the second portion of the first laser beam, and the fourth photodetector may generate the transmission value for the second portion of the second laser beam. The reference values and the transmission values may be used to control the wavelengths of the first laser beam and the second laser beam generated by the dual laser emitter.

DETAILED DESCRIPTION

The following detailed description refers to the accompanying drawings. The same reference numbers in different drawings may identify the same or similar elements.

An optical subassembly, such as a TOSA, a TROSA, or the like, generates laser beams to encode or modulate and transmit information via optical connections using optical channels. The optical subassembly may include a laser emitter, such as a laser chip, a laser diode, or the like, to generate the laser beams. The laser emitter may emit laser beams at a particular target wavelength based, for example, on a predefined grid (e.g., the ITU-C DWDM grid), which simplifies processing of the laser beams and reduces interference between neighboring optical channels. However, in practice, the laser beam emitted by the laser emitter will sometimes deviate from a target wavelength based on manufacturing tolerances, temperature and humidity fluctuations, improper calibration, damage, or the like.

The optical subassembly may use a wavelength locker, such as the single-channel wavelength locker described in connection with FIG. 1, to adjust the emitted laser beam to match the target wavelength. The wavelength locker may include a wavelength filter, such as an etalon, an interferometer, a Fabry-Perot etalon, a Michelson interferometer, or another structure which is used to measure the frequency of the emitted laser beam. A Fabry-Perot etalon includes two substantially parallel, partially reflective surfaces that create a multibeam interference effect in a laser beam that causes the laser beam to be filtered based on a wavelength of the laser beam. The relationship between the filtered optical power of the laser beam and the wavelength of the laser beam may be approximated by a periodic function, such as the periodic Airy function.

An etalon may have different wavelength-filtering effects depending on the optical path of light through the etalon. Whether a wavelength of light on that path will be transmitted at high transmittance or low transmittance depends on the wavelength ($\lambda$) of the light (in vacuum), the angle the light travels through the etalon ($\theta$), the thickness of the etalon (l) and the refractive index of the material between the etalon reflecting surfaces (n). As used herein, "optical path" may include the geometric path to be traversed by an optical beam and/or the effect of the refractive index of the material which the optical beam is to traverse.

Figure 4:
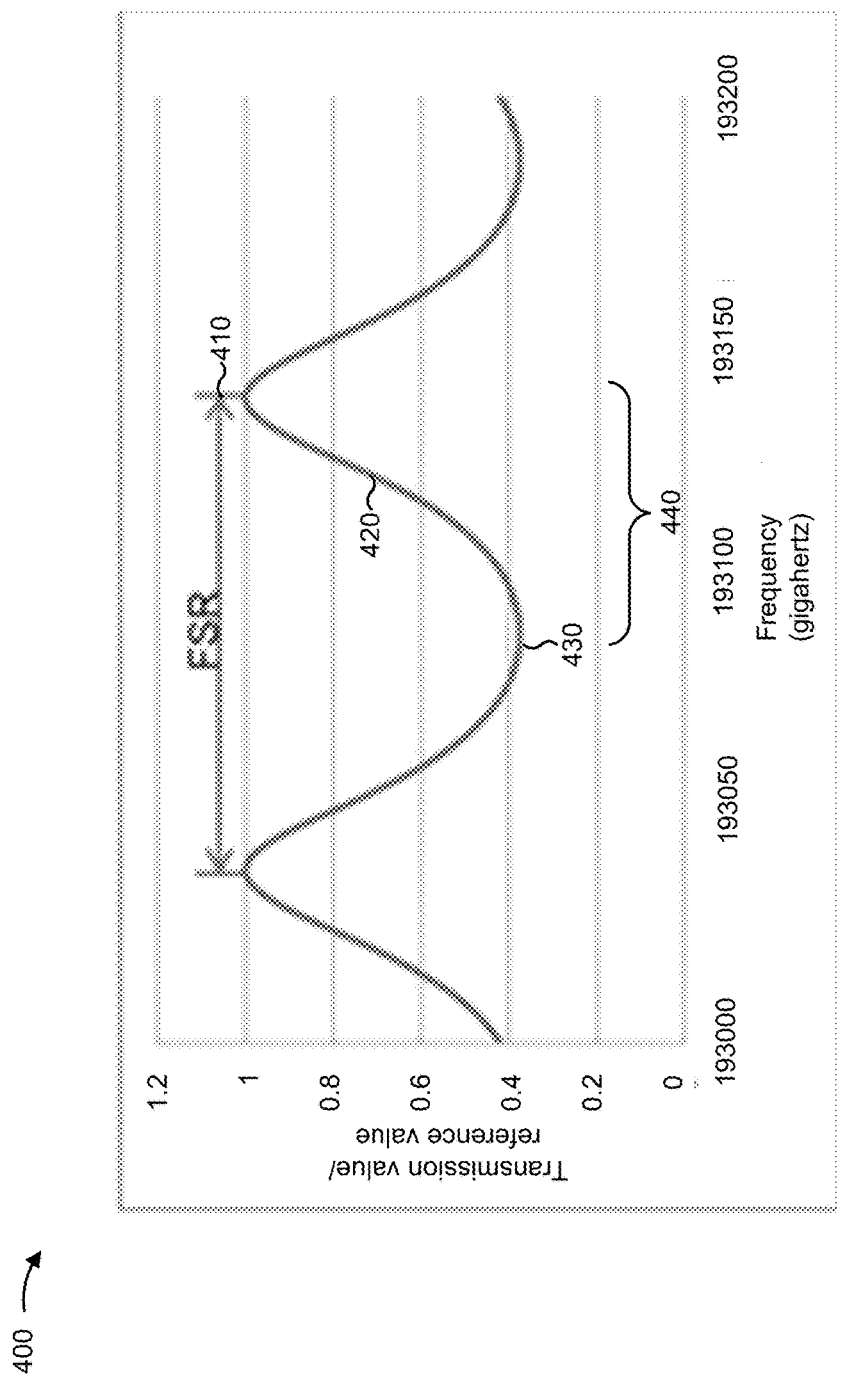
FIG. 4 is an example graph of a relationship between transmission values and reference values describing a laser beam and wavelength of the laser beam.

Referring briefly to FIG. 4, a feedback curve is charted which is based on a ratio of an optical power of the laser beam before filtration (i.e., a reference value) to an optical power of the laser beam after filtration (i.e., a transmission value). The wavelength locker may estimate an observed wavelength (i.e., an emission frequency) of the laser beam using the feedback curve. Based on a difference between the observed wavelength and the target wavelength, the wavelength locker may generate a feedback signal to control the wavelength of the laser beam as generated. The relationship between the filtered optical power of the laser beam and the wavelength of the laser beam may be approximated by a periodic function, such as the periodic Airy's formula (i.e., a wrapped Lorentzian function).

In some cases, two laser beams may need to be wavelength locked within a small area or a small physical space, such as within an optical subassembly. For example, a single laser chip may emit two laser beams, or two laser emitters may be located adjacent to each other. In such a case, a party could implement two single-channel wavelength lockers to wavelength lock the two laser beams. However, implementing two single-channel wavelength lockers uses significant space and duplicates optical components of the single-channel wavelength lockers (e.g., etalons, beam splitters, isolators, lenses, and pigtails), thus increasing a cost of wavelength locking the laser beams.

Implementations described herein enable wavelength locking of multiple laser beams using a dual-channel wavelength locker. The dual-channel wavelength locker determines respective reference values for the two laser beams based on optical powers of the two laser beams, and combines or multiplexes the two laser beams before passing the two laser beams through a wavelength filter. The wavelength filter filters each of the laser beams based on respective wavelengths of the laser beams. The dual-channel wavelength locker may determine both reference values before combining the two laser beams, or may determine one of or both of the reference values after combining the two laser beams. In some implementations, the beams may be wavelength locked to the same wavelength. In some implementations, the beams may be wavelength locked to different wavelengths.

After passing the two laser beams through the wavelength filter, the dual-channel wavelength locker separates or demultiplexes the two laser beams, then determines respective transmission values for the two laser beams based on respective optical powers of the two laser beams. Based on the transmission values and the reference values, the dual-channel wavelength locker controls wavelengths of the two laser beams. In this way, the dual-channel wavelength locker conserves space, expense, and optical components that are otherwise used to implement a pair of single-channel wavelength lockers.

Figure 1:
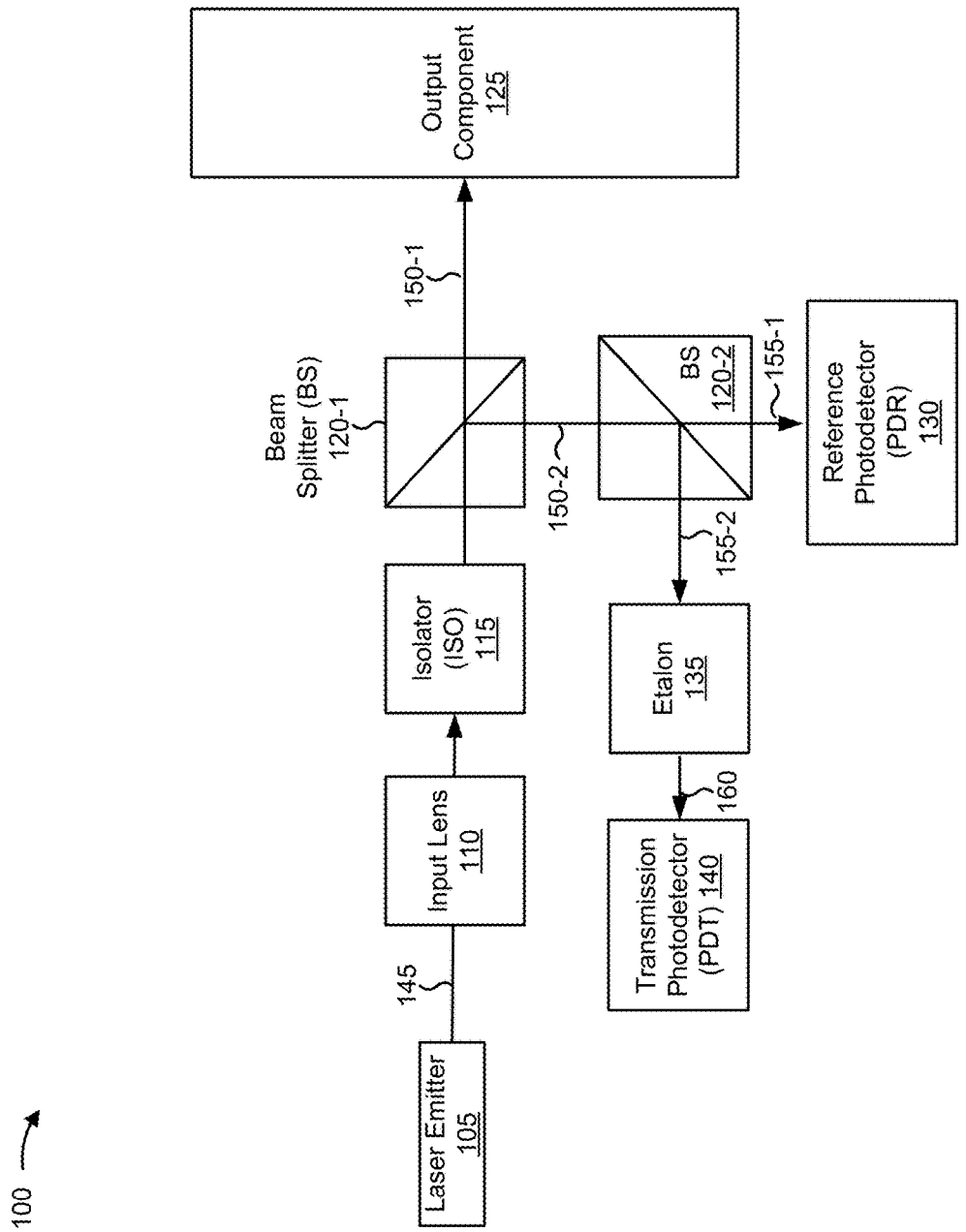
FIG. 1 is a diagram of an example implementation of a single-channel wavelength locker.

FIG. 1 is a diagram of an example implementation of a single-channel wavelength locker 100. Single-channel wavelength locker 100 can be used to wavelength lock a single laser beam. As shown, single-channel wavelength locker 100 includes a laser emitter 105, an input lens 110, an isolator 115 (shown in FIGS. 1, 2A, and 2B as "ISO"), beam splitters 120-1 and 120-2 (shown in FIGS. 1, 2A, and 2B as "BS"), an output component 125, a reference photodetector 130 (shown in FIGS. 1, 2A, and 2B as "PDR"), an etalon 135, and a transmission photodetector 140 (shown in FIGS. 1, 2A, and 2B as "PDT").

Laser emitter 105 includes a solid-state laser, a gas laser, a fiber laser, a semiconductor laser diode, a semiconductor laser chip, or the like, that emits a laser beam 145. Laser emitter 105 emits laser beam 145 to input lens 110 and isolator 115. Input lens 110 includes a cylinder lens, a spherical lens, an aspheric lens, or the like, that collimates laser beam 145. Isolator 115 includes an optical isolator, such as a Faraday isolator, or the like, to reduce back-reflection of laser light from components of single-channel wavelength locker 100 to laser emitter 105. In some implementations, isolator 115 may be located between laser emitter 105 and input lens 110 or in a different location.

As shown, input lens 110 and isolator 115 transmit laser beam 145 to beam splitter 120-1. Beam splitter 120-1 includes a device that can split a laser beam (e.g., laser beam 145) into two or more laser beams (e.g., laser beams 150-1 and 150-2). For example, beam splitter 120-1 includes a partially reflecting mirror (e.g., a dielectric mirror or a dichroic mirror), a beam splitter cube (e.g., a glass cube or a crystalline cube), a fiber-optic beam splitter, or the like.

In some cases, laser beam 150-1, which continues to output component 125, is more powerful than laser beam 150-2, which is used to perform the wavelength locking process. For example, based on a reflectivity of beam splitter 120-1, laser beam 150-1 may have 10 times more energy than laser beam 150-2, may have 100 times more energy than laser beam 150-2, or the like.

Output component 125 includes one or more components that receive laser beam 150-1 and/or modify laser beam 150-1 for output. For example, output component 125 may include a lens that focuses, collimates, or de-collimates laser beam 150-1, a polarization-maintaining pigtail connected with an optical fiber to which laser beam 150-1 is transmitted, an amplifier, or the like.

As shown, beam splitter 120-2 splits laser beam 150-2 into laser beams 155-1 and 155-2. Beam splitter 120-2 includes one or more of the devices described in connection with beam splitter 120-1. As shown, beam splitter 120-2 passes laser beam 155-1 to reference photodetector 130. Reference photodetector 130 includes a photodetector, such as a photodiode, a light sensor, or the like, that generates a reference current proportional to an optical power of laser beam 155-1. In some cases, reference photodetector 130 may be connected to laser emitter 105 and may provide the reference current to laser emitter 105 for use by laser emitter 105 to regulate a wavelength of laser beam 145. Additionally, or alternatively, a controller may be included in single-channel wavelength locker 100 and may receive the reference current. The controller may take the form of a digital signal processor, a temperature controller, or another type of component that can control laser emitter 105 to adjust the wavelength of laser beam 145.

As shown, beam splitter 120-2 reflects laser beam 155-2 to etalon 135. Etalon 135 includes an interferometer (e.g., a Michelson interferometer, a Fabry-Perot interferometer, or a Fabry-Perot etalon) that wavelength filters laser beams that enter etalon 135. The optical power of an output transmission of etalon 135 (e.g., laser beam 160) varies periodically with regard to the frequency of an input to etalon 135 (e.g., laser beam 155-2). For a more detailed explanation of the relationship between the frequency of laser beam 155-2 and the optical power at which etalon 135 transmits laser beam 160, refer to FIGS. 3 and 4, below.

Transmission photodetector 140 receives laser beam 160 and generates a transmission current proportional to an energy of laser beam 160. Transmission photodetector 140 includes a photodetector, such as a photodiode, a light sensor, or the like. In some cases, transmission photodetector 140 may be connected to laser emitter 105 and may provide the transmission current to laser emitter 105 for use by laser emitter 105 to regulate the wavelength of laser beam 145. Additionally, or alternatively, a controller, as described above, may receive the transmission current and control laser emitter 105 to adjust the wavelength of laser beam 145.

Based on a ratio of the reference current generated by reference photodetector 130 and the transmission current generated by transmission photodetector 140, laser emitter 105, or a controller connected to laser emitter 105, may control a wavelength of laser beam 145. For example, the controller may determine an observed wavelength based on the ratio of the reference current and the transmission current. Based on a difference between the observed wavelength and a reference wavelength to which laser emitter 105 is to be wavelength locked, or based on a difference between the ratio and a target ratio associated with the reference wavelength, the controller may generate a feedback signal to cause laser emitter 105 to modify the wavelength of the emitted laser beam. In this way, single-channel wavelength locker 100 controls the wavelength of laser beams generated by laser emitter 105.

However, single-channel wavelength locker 100 is incapable of wavelength locking multiple input laser beams. For example, to wavelength lock two laser beams from two laser emitters, two single-channel wavelength lockers 100 are needed, which uses significant space and increases cost of implementing multiple laser emitters.

As indicated above, FIG. 1 is provided merely as an example. Other examples are possible and may differ from what was described with regard to FIG. 1.

Figure 2A:
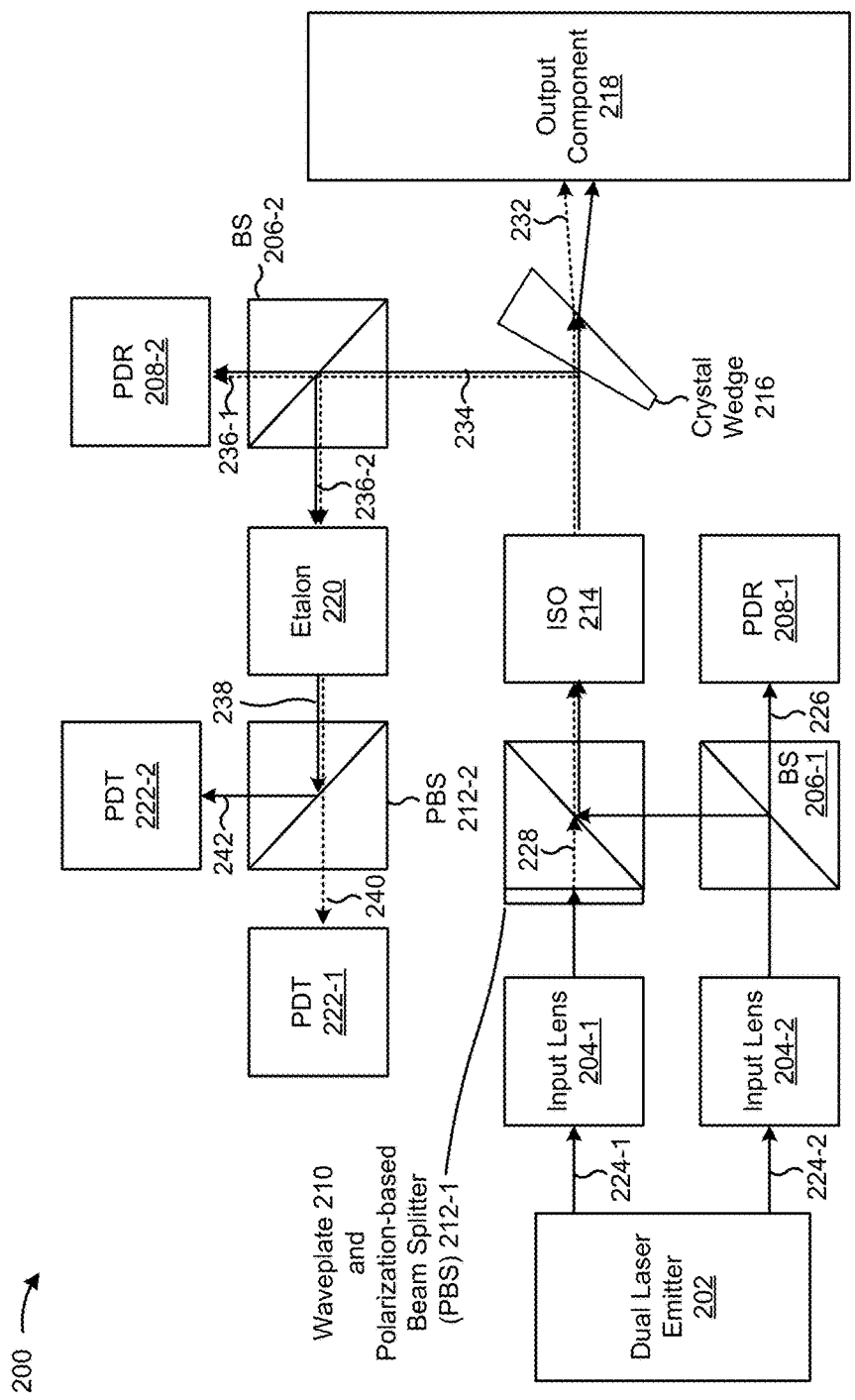
FIGS. 2A-2C are diagrams of example implementations of a dual-channel wavelength locker.
Figure 2B:
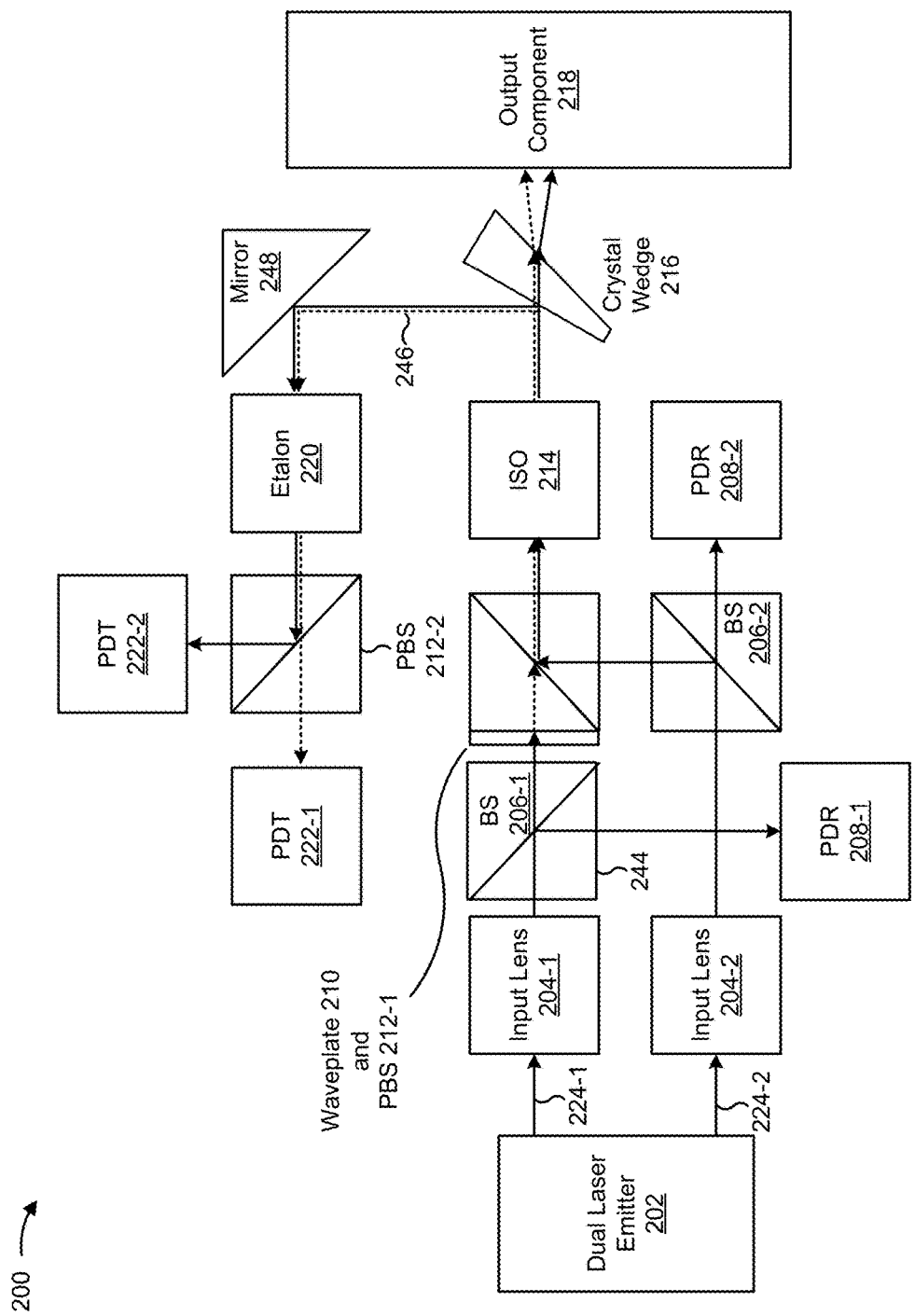
Figure 2C:
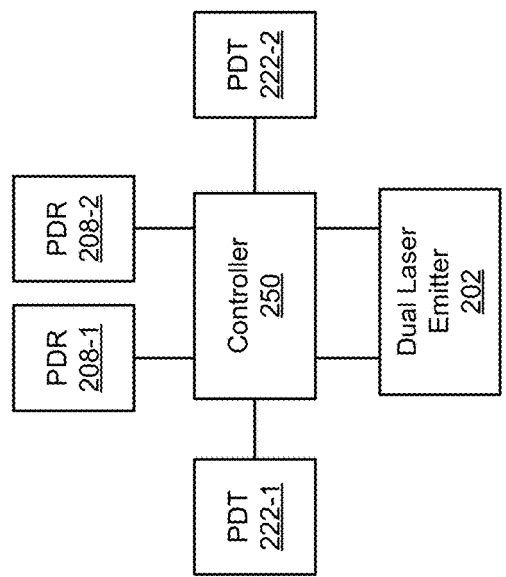

FIGS. 2A-2C are diagrams of example implementations of a dual-channel wavelength locker 200. As shown in FIG. 2A, dual-channel wavelength locker 200 includes a dual laser emitter 202, input lenses 204-1 and 204-2, beam splitters 206-1 and 206-2, reference photodetectors 208-1 and 208-2, a waveplate 210, polarization-based beam splitters 212-1 and 212-2, an isolator 214, a crystal wedge 216, an output component 218, an etalon 220, and transmission photodetectors 222-1 and 222-2. Components and/or devices included in input lenses 204-1 and 204-2, beam splitters 206-1 and 206-2, reference photodetectors 208-1 and 208-2, isolator 214, output component 218, etalon 220, and transmission photodetectors 222-1 and 222-2 are described in more detail in connection with the corresponding components and/or devices in FIG. 1, above (i.e., input lens 110, isolator 115, beam splitters 120-1 and 120-2, output component 125, reference photodetector 130, etalon 135, and transmission photodetector 140, respectively).

Dual laser emitter 202 includes one or more devices that collectively emit two laser beams. For example, dual laser emitter 202 may include a single device that emits two laser beams, two separate devices that each emits a single laser beam, or the like. As another example, dual laser emitter 202 may include a solid-state laser, a gas laser, a fiber laser, a semiconductor laser (e.g., a laser diode or a laser chip), or the like, that emits laser beam 224-1 or 224-2. In some implementations, dual laser emitter 202 may include a dual laser chip that emits laser beams 224-1 and 224-2. In some implementations, dual laser emitter 202 may include one or more tunable laser diodes that can be tuned to a particular wavelength and/or optical power based on currents generated by reference photodetectors 208-1 and 208-2 and/or by transmission photodetectors 222-1 and 222-2.

Dual laser emitter 202 generates a first laser beam (e.g., laser beam 224-1) and a second laser beam (e.g., laser beam 224-2). In some implementations, when generated by dual laser emitter 202, the first laser beam and the second laser beam may be associated with the same polarization state. Here, laser beams with a first polarization (e.g., a "p" polarization) are shown using solid lines, and laser beams with a second polarization that is orthogonal to the first polarization (e.g., an "s" polarization) are shown using dotted lines. In some implementations, dual-channel wavelength locker 200 may not include dual laser emitter 202. In such cases, dual-channel wavelength locker 200 may receive laser beams 224-1 and 224-2 from another device, such as an optical fiber connected to one or more laser emitters, or the like.

As shown, beam splitter 206-1 receives the second laser beam via input lens 204-2. As shown by reference number 226, beam splitter 206-1 passes a first portion of the second laser beam to reference photodetector 208-1. Reference photodetector 208-1 generates a reference current based on an optical power of the first portion of the second laser beam, and may provide the reference current to dual laser emitter 202. Dual laser emitter 202 may determine a reference value for laser beam 224-2 based on the reference current (e.g., based on an amperage of the current). As further shown, beam splitter 206-1 reflects a second portion of the second laser beam to polarization-based beam splitter 212-1.

As shown, the first laser beam (e.g., laser beam 224-1) passes through input lens 204-1 to waveplate 210. Waveplate 210 includes a waveplate (e.g., a $\lambda/2$ waveplate or a $\lambda/4$ waveplate) that polarizes the first laser beam to the second polarization state. As shown by reference number 228, after passing through waveplate 210, the first laser beam is shown with a dotted line, indicating that the first laser beam is polarized to the second polarization state.

Polarization-based beam splitter 212-1 includes a beam splitter that reflects, passes, or partially passes a laser beam based on a polarization state of the laser beam. For example, polarization-based beam splitter 212-1 may include a dichroic mirror, or the like. Polarization-based beam splitter 212-1 passes the first laser beam to isolator 214 and reflects the second laser beam to isolator 214 based on the respective polarization states of the first laser beam and the second laser beam. In this way, polarization-based beam splitter 212-1 combines the first laser beam and the second laser beam into a combined laser beam. In some implementations, isolator 214 may be located between input lens 204-1 and polarization-based beam splitter 212-1, in between input lens 204-2 and beam splitter 206-1, or in another location.

As further shown, isolator 214 passes the first laser beam and the second laser beam (i.e., the combined laser beam) to crystal wedge 216. In this way, a single isolator 214 processes the first laser beam and the second laser beam, which conserves space and resources that would otherwise be used for a second isolator 214.

Crystal wedge 216 includes a crystalline structure, a glass structure, or the like, which passes, reflects, and/or partially passes laser beams. Crystal wedge 216 may include a birefringent crystal, a birefringent coating, or the like, that causes laser beams of different polarization states to be passed at different angles. Crystal wedge 216 partially passes portions of the first laser beam and the second laser beam to output component 218 and partially reflects portions of the first laser beam and the second laser beam to beam splitter 206-2.

As shown by reference number 232, in some implementations, crystal wedge 216 may pass the first laser beam and the second laser beam with an angular separation. For example, output component 218 may include a device, such as a dual polarization-maintaining pigtail or the like, that requires a particular pitch (e.g., spatial separation) between the first laser beam and the second laser beam. By passing the first laser beam and the second laser beam with the angular separation, crystal wedge 216 can provide the first laser beam and the second laser beam at the particular pitch. In some implementations, output component 218 may include a collimator that passes the first laser beam and the second laser beam at a substantially parallel angle. In some implementations, output component 218 may include a dual pigtail, a pair of optical fibers, or the like, that receives the first laser beam and the second laser beam. By using the dual pigtail, the pair of optical fibers, or the like, output component 218 conserves space and resources that would otherwise be used for a pair of output components.

As shown by reference number 234, crystal wedge 216 reflects a portion (e.g., 20 percent, 10 percent, 5 percent, or 1 percent) of the first laser beam and the second laser beam to beam splitter 206-2. As shown, beam splitter 206-2 splits the first laser beam and the second laser beam into laser beams 236-1 and 236-2. As further shown, beam splitter 206-2 passes laser beam 236-1 to reference photodetector 208-2, which generates a reference current based on a combined power of the first laser beam and the second laser beam (e.g., laser beam 236-1). Based on the reference currents from reference photodetectors 208-1 and 208-2, dual-channel wavelength locker 200 controls the wavelength of the laser beams emitted by dual laser emitter 202, as described in more detail in connection with FIGS. 3 and 4, below.

As shown, laser beam 236-2 (e.g., the portion of the first laser beam and the second laser beam reflected by beam splitter 206-2) is filtered by etalon 220 to form laser beam 238. Etalon 220 wavelength filters the portions of the first laser beam and the second laser beam and passes each of the first laser beam and the second laser beam at respective optical powers based on properties of etalon 220 and based on wavelengths of the first laser beam and the second laser beam, as described in more detail in connection with etalon 135 in FIG. 1, and in connection with FIGS. 3 and 4.

As shown, laser beam 238 (e.g., the first laser beam and the second laser beam as filtered by etalon 220) continues to polarization-based beam splitter 212-2, which passes the remaining portion of the first laser beam as laser beam 240 and reflects the remaining portion of the second laser beam as laser beam 242. Polarization-based beam splitter 212-2 includes one or more of the components described with regard to polarization-based beam splitter 212-1, above.

As shown, transmission photodetector 222-1 receives the first laser beam (e.g., laser beam 240). Transmission photodetector 222-1 generates a first transmission current based on energy of the first laser beam. As further shown, transmission photodetector 222-2 receives the second laser beam (e.g., laser beam 242). Transmission photodetector 222-2 generates a second transmission current based on the optical power of the second laser beam.

Based on the transmission currents generated by transmission photodetectors 222-1 and 222-2 and reference currents generated by reference photodetectors 208-1 and 208-2, dual laser emitter 202 controls wavelength/frequency of the first laser beam and the second laser beam and, therefore, controls the wavelength/frequency of the laser beams outputted by dual-channel wavelength locker 200. For a more detailed example of operations performed to control the wavelength/frequency of the laser beams, refer to FIG. 2C and block 350 of FIG. 3, below.

In this way, dual-channel wavelength locker 200 controls a wavelength of two laser beams by combining the two laser beams into a combined laser beam. By combining the laser beams, dual-channel wavelength locker 200 can use shared components to wavelength lock two laser beams, which reduces size and expense of dual-channel wavelength locker 200.

FIG. 2B shows an example implementation of dual-channel wavelength locker 200 in which both of the reference values are determined before the first laser beam and the second laser beam are combined. As shown in FIG. 2B, and by reference number 244, beam splitter 206-1 may split laser beam 224-1 (e.g., the first laser beam), and may partially reflect laser beam 224-1 to reference photodetector 208-1. Reference photodetector 208-1 generates a reference current based on an optical power of laser beam 224-1, which can be used to determine a reference value for laser beam 224-1.

As further shown, beam splitter 206-2 may partially pass laser beam 224-2 to reference photodetector 208-2, and may partially reflect laser beam 224-2 to polarization-based beam splitter 212-1. Reference photodetector 208-2 generates a current based on an optical power of laser beam 224-2, which can be used to determine a reference value for laser beam 224-2. Polarization-based beam splitter 212-1 combines the first laser beam and the second laser beam based on respective polarization states of the first laser beam and the second laser beam.

As shown by reference number 246, after the first laser beam and the second laser beam are combined by polarization-based beam splitter 212-1, the first laser beam and the second laser beam continue to mirror 248, which reflects the first laser beam and the second laser beam to etalon 220. Mirror 248 includes a reflective surface capable of reflecting a laser beam, such as a dielectric mirror, a dichroic mirror, or the like. In some implementations, dual-channel wavelength locker 200 may not include mirror 248. In such cases, dual-channel wavelength locker 200 may be configured such that crystal wedge 216 reflects the first laser beam and the second laser beam to etalon 220.

By determining reference values for the first laser beam and the second laser beam before the first laser beam and the second laser beam are combined, dual-channel wavelength locker 200, shown in FIG. 2B, simplifies determination of the reference values and the transmission values, which may simplify implementation of dual-channel wavelength locker 200. On the other hand, by determining reference values after the laser beams are combined, dual-channel wavelength locker 200, as shown in FIG. 2A, can be implemented without mirror 248, which reduces cost and size of dual-channel wavelength locker 200.

FIG. 2C is a diagram of an example implementation of a control system for dual-channel wavelength locker 200. As shown in FIG. 2C, in some implementations, dual-channel wavelength locker 200 may include controller 250. Controller 250 is implemented in hardware, firmware, or a combination of hardware and software. Controller 250 may include a processor, such as a digital signal processor, a microprocessor, an integrated circuit (e.g., a photonic integrated circuit, an application-specific integrated circuit, etc.), a field-programmable gate array, or the like. Controller 250 may also include other components that interact with the processor, such as a memory device, a communication interface, an input component, and/or an output component. The memory device may store instructions or data used by the processor. The communication interface may permit the processor to communicate with other components of the laser system, to receive commands from external to the laser system, and/or to provide data external to the laser system. Controller 250 may include computer-readable instructions stored in a non-transitory computer readable medium for execution by a general purpose computer, reconfigurable hardware (such as FPGAs), application-specific hardware (such as ASICs), and/or combinations of these implementation technologies.

As shown, controller 250 may be connected with reference photodetectors 208-1 and 208-2, transmission photodetectors 222-1 and 222-2, and dual laser emitter 202. Controller 250 may receive the transmission currents generated by transmission photodetectors 222-1 and 222-2 and the reference current generated by reference photodetectors 208-1 and 208-2. Controller 250 may receive and/or store reference wavelengths corresponding to beams 224-1 and 224-2 emitted by dual laser emitter 202. The reference wavelengths may identify respective target wavelengths based on which the beams are to be wavelength locked.

Controller 250 may determine an observed frequency of a beam (e.g., laser beam 224-1 or 224-2) based on determining (e.g., looking up, computing, etc.) the ratio of the corresponding transmission value and reference value and using a feedback curve. For example, for a given feedback curve, controller 250 may store information correlating particular ratios with corresponding observed frequencies, and controller 250 may use the stored information to determine an observed frequency of the beam based on the ratio. Controller 250 may generate a feedback signal to control the wavelength of the beam based on a difference between the observed frequency and the reference frequency. Controller 250 may cause dual laser emitter 202 to modify the frequency of the beam to cause the observed frequency to approximately match or approach the reference frequency (e.g., by modifying a tuning current that is provided to dual laser emitter 202). Controller 250 may perform these operations for laser beams 224-1 and 224-2, thereby wavelength locking both laser beams generated by dual laser emitter 202.

As indicated above, FIGS. 2A-2C are provided merely as examples. Other examples are possible and may differ from what was described with regard to FIGS. 2A-2C.

Figure 3:
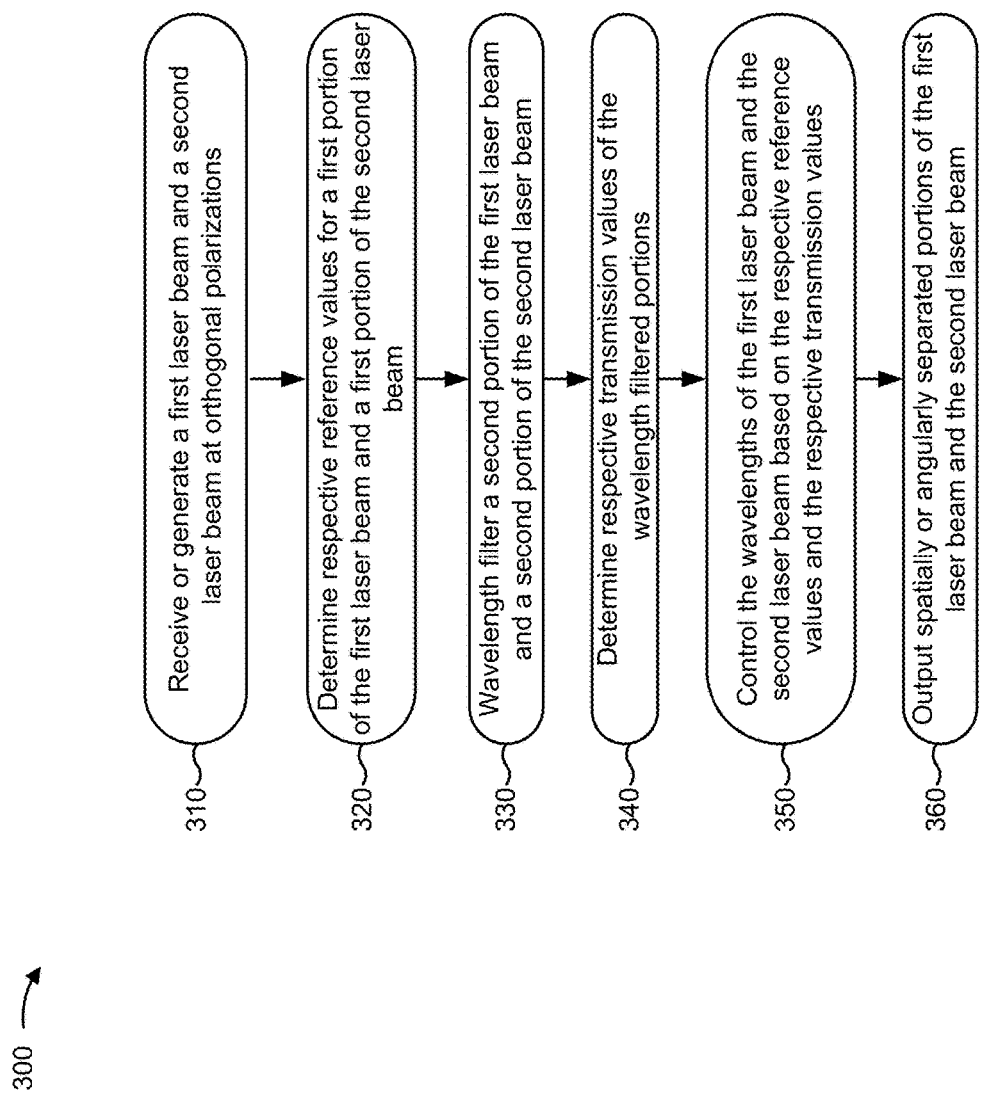
FIG. 3 is a flow chart of an example process for performing a dual-channel wavelength locking process.

FIG. 3 is a flow chart of an example process 300 for performing a dual-channel wavelength locking process. Process 300 may be performed by dual-channel wavelength locker 200.

As shown in FIG. 3, process 300 may include receiving or generating a first laser beam and a second laser beam at orthogonal polarizations (block 310). For example, dual-channel wavelength locker 200 may receive or generate a first laser beam and a second laser beam. In some implementations, when dual-channel wavelength locker 200 includes dual laser emitter 202, dual-channel wavelength locker 200 generates the first laser beam and the second laser beam. In a situation where dual-channel wavelength locker 200 does not include dual laser emitter 202, dual-channel wavelength locker 200 receives the first laser beam and the second laser beam from another device, such as an optical fiber, a pigtail connected to an optical fiber, a dual laser emitter, or the like. In some implementations, the first laser beam and the second laser beam may have different wavelengths.

In some implementations, both laser beams may have the same polarization state when received or generated. In such cases, dual-channel wavelength locker 200 may change the first laser beam and the second laser beam to orthogonal polarization states. For example, dual-channel wavelength locker 200 may pass the first laser beam or the second laser beam through a waveplate (e.g., a half waveplate) to polarize the first laser beam or the second laser beam such that the first laser beam and the second laser beam have orthogonal polarization states.

In some implementations, dual-channel wavelength locker 200 may receive the first laser beam and/or the second laser beam in an unpolarized state. In such implementations, dual-channel wavelength locker 200 may pass the first laser beam through a first waveplate to change the first laser beam to a first polarization state, and may pass the second laser beam through a second waveplate to change the second laser beam to a second polarization state that is orthogonal to the first polarization state. In this way, dual-channel wavelength locker 200 can process unpolarized light, which simplifies generation of the first laser beam and the second laser beam.

As further shown in FIG. 3, process 300 may include determining respective reference values for a first portion of the first laser beam and a first portion of the second laser beam (block 320). For example, dual-channel wavelength locker 200 may determine respective reference values for a first portion of the first laser beam and a first portion of the second laser beam. The first laser beam and the second laser beam may be split into respective portions by beam splitters 206-1 and/or 206-2. Dual-channel wavelength locker 200 determines the respective reference values based on reference currents generated by reference photodetectors 208-1 and 208-2. For example, reference photodetectors 208-1 and 208-2 may pass their respective reference currents to controller 250, and controller 250 may determine the reference values based on the reference currents.

In some implementations, as in FIG. 2A, dual-channel wavelength locker 200 determines the reference values based on a current generated by reference photodetector 208-1 which receives laser beam 226 corresponding to the second laser beam, and based on a current generated by reference photodetector 208-2 which receives laser beam 236-1 corresponding to the first laser beam and the second laser beam. In such implementations, the relationship between optical powers of the laser beams at output component 218 and the currents generated by reference photodetectors 208-1 and 208-2 may be described by equation 1 and equation 2, below:

$$I_{PDR1} = a \times P_1, \text{ and} \qquad \text{Equation 1:}$$

$$I_{PDR2} = b \times P_1 + c \times P_2, \qquad \text{Equation 2:}$$

where $I_{PDR1}$ is the reference current generated by reference photodetector 208-1, $I_{PDR2}$ is the reference current generated by reference photodetector 208-2, $P_1$ is the optical power of the first laser beam at output component 218 (e.g., after being transmitted by crystal wedge 216), $P_2$ is the optical power of the second laser beam at output component 218, and a, b, and c are coefficients that are determined based on a geometry, configuration, and calibration of dual-channel wavelength locker 200.

The above equations may apply in a situation where dual-channel wavelength locker 200 determines one or more reference values after combining the first laser beam and the second laser beam. For example, in FIG. 2A, reference photodetector 208-2 generates a reference current for portions of the first laser beam and the second laser beam after the first laser beam is combined with the second laser beam by polarization-based beam splitter 206-1. Dual-channel wavelength locker 200 may determine reference values based on the generated reference currents using Equations 1 and 2. In this way, dual-channel wavelength locker 200 reduces a quantity of freespace optical components included in dual-channel wavelength locker 200 (e.g., mirrors, reflective crystals, etc.), which reduces complexity and expense of fabricating and calibrating dual-channel wavelength locker 200.

In some implementations, dual-channel wavelength locker 200 may determine each reference value before combining the first laser beam and the second laser beam. For example, in FIG. 2B, reference photodetectors 208-1 and 208-2 generate the respective reference currents for the laser beams before the laser beams are combined by polarization-based beam splitter 212-1. By generating a respective reference current for each laser beam rather than generating a reference current for a combined laser beam, as in FIG. 2A, dual-channel wavelength locker 200 in FIG. 2B simplifies determination of the signals used to control wavelengths of the first laser beam and the second laser beam by controller 250, and thereby simplifies implementation of dual-channel wavelength locker 200.

In some implementations, dual-channel wavelength locker 200 may include an angle between the laser beams when combining the laser beams, which may simplify implementation of output component 218. For example, input lens 204-1, input lens 204-2, beam splitter 206-1, beam splitter 206-2, or another component may be configured to pass and/or reflect the first laser beam and the second laser beam with a particular angular separation between the first laser beam and the second laser beam (e.g., 0.1 degrees, 0.7 degrees, 1 degree, etc.). This may simplify implementation of crystal wedge 216 and/or output component 218 (e.g., a lens of output component 218 or a pigtail of output component 218), which reduces complexity and expense of fabricating and implementing dual-channel wavelength locker 200.

As further shown in FIG. 3, process 300 may include wavelength filtering a second portion of the first laser beam and a second portion of the second laser beam (block 330). For example, dual-channel wavelength locker 200 may combine portions of the first laser beam and the second laser beam to form a combined laser beam. Dual-channel wavelength locker 200 may pass the combined laser beam through etalon 220. Etalon 220 wavelength filters the first laser beam and the second laser beam based on a multibeam interference effect.

When a frequency of a laser beam matches a resonant frequency of etalon 220 on a particular optical path, etalon 220 transmits the laser beam at substantially full power. When the frequency of the laser beam does not match the resonant frequency of etalon 220 on the particular optical path, etalon 220 filters the laser beam to a fraction of its full power. For example, when the frequency does not match the resonant frequency, etalon 220 may transmit the laser beam at 80% power, at 60% power, at 20% power, or the like. The optical power of the transmitted laser beam can be approximated based on a relationship between the length of the optical path of the laser beam in etalon 220, the material properties of etalon 220, and the wavelength of the laser beam, as described in more detail elsewhere herein.

When etalon 220 wavelength filters a laser beam that includes multiple different polarization states, such as the combined laser beam, etalon 220 filters each laser beam independently. Therefore, a first laser beam may be transmitted at full power, and a second laser beam may be filtered to a fraction of its original power, based on the respective wavelengths and respective optical paths of the first laser beam and the second laser beam.

As further shown in FIG. 3, process 300 may include determining respective transmission values of the wavelength filtered portions (block 340). For example, dual-channel wavelength locker 200 may determine respective transmission values of the wavelength filtered portions of the first laser beam and the second laser beam. Dual-channel wavelength locker 200 may use transmission photodetectors 222-1 and 222-2 to determine the transmission values for the first laser beam and the second laser beam, respectively. For example, based on amperages of currents generated by transmission photodetectors 222-1 and 222-2 corresponding to the first laser beam and the second laser beam, controller 250 of dual-channel wavelength locker 200 may determine the transmission values.

As one possible example, the current generated by transmission photodetectors 222-1 and 222-2, shown in FIG. 2A, may be related to optical powers of the laser beams at output component 218 by the following equations 3 and 4:

$$I_{PDT1} = d \times P_1 \times T1(f_1), \text{ and} \qquad \text{Equation 3:}$$

$$I_{PDT2} = e \times P_2 \times T2(f_2), \qquad \text{Equation 4:}$$

where $I_{PDT1}$ identifies the current generated with regard to the first laser beam, $I_{PDT2}$ identifies the current generated with regard to the second laser beam, $P_1$ identifies an optical power of the first laser beam at output component 218, $P_2$ identifies an optical power of the second laser beam at output component 218, $f_1$ identifies a frequency of the first laser beam, $f_2$ identifies a frequency of the second laser beam, T1 is a function that defines a transmission power of the first laser beam from etalon 220 based on $f_1$, T2 is a function that defines a transmission power of the second laser beam from etalon 220 based on $f_2$, and d and e are coefficients that are determined based on a configuration and/or calibration of dual-channel wavelength locker 200. Outputs of T1 and T2 may vary based on, for example, geometry of etalon 220, effective optical paths of the laser beams in etalon 220, material properties of etalon 220, values of $f_1$ and $f_2$ as compared to a target value, or the like.

Dual-channel wavelength locker 200 may use polarization-based beam splitter 212-2 to separate the first laser beam from the second laser beam based on the polarization states of the laser beams. For example, to determine the respective transmission values, polarization-based beam splitter 212-2 may pass the first laser beam to transmission photodetector 222-1 and reflect the second beam to transmission photodetector 222-2 based on the polarization states of the first and second laser beams. Transmission photodetectors 222-1 and 222-2 may generate respective transmission currents, and may pass the transmission currents to controller 250, which may determine transmission values based on the transmission currents. In this way, polarization-based beam splitter 212-2 enables the first laser beam and the second laser beam to share optical components (e.g., isolator 214, crystal wedge 216, output component 218, etalon 220, etc.), thereby reducing cost and size of dual-channel wavelength locker 200.

As further shown in FIG. 3, process 300 may include controlling the wavelengths of the first laser beam and the second laser beam based on the respective reference values and the respective transmission values (block 350). For example, dual-channel wavelength locker 200 (e.g., controller 250 of dual-channel wavelength locker 200) may control the wavelength of the first laser beam and the second laser beam based on the transmission values and the reference values corresponding to the first laser beam and the second laser beam.

As one possible example, dual-channel wavelength locker 200 may control wavelengths of the laser beams based on the values of S1 and S2 in equations 5 and 6, below:

$$S1(f_1) = (d \times T1(f_1))/(a \times b) = I_{PDT1}/(a \times I_{PDR2} - c \times I_{PDR1}),$$
and  Equation 5:

$$S2(f_2) = (e \times T2(f_2))/a = I_{PDT2}/I_{PDR1}.$$  Equation 6:

The variables shown in equations 5 and 6 are described in more detail in connection with equations 1 through 4, above. S1 corresponds to the first laser beam, and S2 corresponds to the second laser beam. For an illustration of potential S1 and S2 values, refer to graph 400 in FIG. 4, below.

As can be seen in the above equations, S1 and S2 depend on ratios of transmission values to reference values. For example, S1 depends on the ratio of the transmission value for the first laser beam (i.e., a measure of amperage of the current generated by transmission photodetector 222-1) to the reference value for the first laser beam (i.e., a measure of amperage of the current generated by reference photodetector 208-1 subtracted from a measure of amperage of the current generated by reference photodetector 208-2, scaled based on the coefficients a and c). As another example, S2 depends on the ratio of the transmission value for the second laser beam (i.e., a measure of amperage of the current generated by transmission photodetector 222-2) to the reference value for the second laser beam (i.e., a measure of amperage of the current generated by reference photodetector 208-1).

Based on S1 and S2, dual-channel wavelength locker 200 regulates frequency of the first laser beam and the second laser beam, respectively. For example, assume that a laser beam is associated with a target frequency of 193,200 GHz, and assume that a corresponding target value of S1 is 0.67, indicating that a ratio of a transmission value to a reference value for a laser beam at the target frequency is equal to 0.67. When dual-channel wavelength locker 200 (e.g., controller 250) determines a value of S1 that is not equal to 0.67, controller 250 causes dual-channel wavelength locker 200 to increase or decrease a frequency of the laser beam accordingly. For example, dual laser emitter 202 may include a tunable laser diode with a temperature component (capable of regulating a temperature of the tunable laser diode), an adjustable cavity, a current-modulated laser component, or the like, that can modify the frequency of the laser beam based on a feedback signal from controller 250.

As further shown in FIG. 3, process 300 may include outputting spatially or angularly separated portions of the first laser beam and the second laser beam (block 360). For example, dual-channel wavelength locker 200 (e.g., crystal wedge 216 and/or output component 218) may output spatially and/or angularly separated portions of the first laser beam and the second laser beam. In some implementations, crystal wedge 216 may introduce the spatial and/or angular separation to the spatially or angularly separated portions, as described in connection with reference number 232, above. Additionally, or alternatively, output component 218 may introduce the spatial and/or angular separation (e.g., using a lens, an optical fiber, or a freespace optical component). In some implementations, dual-channel wavelength locker 200 may output the first laser beam and the second laser beam to a dual polarization-maintaining pigtail.

The outputted portions may have optical powers that are approximately 80 percent, 90 percent, 95 percent, 99 percent, or the like, of the optical powers of the first laser beam and the second laser beam when generated. For example, crystal wedge 216 may transmit a large portion of the first laser beam and the second laser beam (e.g., 80 percent, 90 percent, 95 percent, 99 percent, etc.) and may reflect a remainder of the first laser beam and the second laser beam (e.g., to beam splitter 206-2 or to mirror 248). By transmitting a large portion of the first laser beam and the second laser beam, crystal wedge 216 reduces power usage by dual laser emitter 202.

In this way, dual-channel wavelength locker 200 wavelength locks two laser beams using shared components (e.g., polarization-based beam splitters 212-1 and 212-2, isolator 214 crystal wedge 216, output component 218, and etalon 220) which reduces cost and simplifies implementation of dual-channel wavelength locker 200, and which saves space that would otherwise be used for a pair of single-channel wavelength lockers.

Although FIG. 3 shows example blocks of process 300, in some implementations, process 300 may include additional blocks, fewer blocks, different blocks, or differently arranged blocks than those depicted in FIG. 3. Additionally, or alternatively, two or more of the blocks of process 300 may be performed in parallel.

FIG. 4 is an example graph 400 of a relationship between transmission values and reference values describing a laser beam and wavelength of the laser beam. The relationship between transmission values and reference values is referred to herein as a feedback curve. The etalon described with regard to FIG. 4 may correspond to, for example, etalon 135, shown in FIG. 1, and etalon 220, shown in FIGS. 2A and 2B.

Etalon 220 passes laser beams at substantially full power, or less than full power, based on a frequency of the laser beams and an optical path that the laser beams traverse in etalon 220. The optical power of a passed laser beam can be approximated by Airy's formula (i.e., a wrapped Lorentzian function), based on the frequency of the passed laser beam and the material and geometric properties of the optical path taken through etalon 220. For example, as shown by reference number 410, laser beams that are associated with particular frequencies (e.g., resonant frequencies of etalon 220) are passed at substantially full power on a given optical path, shown here as maxima of the Airy's formula. The spacing between the particular frequencies is referred to as a free spectral range (FSR).

In the example curve charted in FIG. 4, laser beams with frequencies of roughly 193,030 GHz, 193,130 GHz, and so on, are passed at substantially full power. Further, laser beams with frequencies of approximately 193,080 GHz, 193,180 GHz, and so on, are passed at a minimum optical power of approximately 38% of the maximum. Based on a ratio of an output energy of a laser beam (e.g., a transmission value) and an input optical power of a laser beam (e.g., a reference value), dual-channel wavelength locker 200 may determine an observed frequency of the laser beam. For example, dual-channel wavelength locker 200 may store information identifying a relationship between output energies and frequencies (i.e., the charted feedback curve), and may use the stored information to determine the observed frequency. Based on a difference between the observed frequency and a reference frequency (e.g., a target frequency), dual-channel wavelength locker 200 may generate a feedback signal, as described in more detail elsewhere herein.

Etalon 220 may be configured to cause etalon 220 to pass laser beams of a target frequency on a given optical path at a particular optical power, such as the optical power corresponding to the ratio shown by reference number 420. The ratio shown by reference number 420 may be used because fluctuations in the ratio at reference number 420 more precisely identify the frequency of the laser beam than fluctuations at, for example, the ratio shown by reference number 430. For example, at reference number 430, a fluctuation from a ratio of 0.38 to a ratio of 0.40 encompasses approximately 20 GHz of frequency, whereas a similar fluctuation at reference number 420 encompasses approximately 2 GHz of frequency. In this way, dual-channel wavelength locker 200 more accurately measures frequency fluctuations, which improves tuning of dual laser emitter 202.

Furthermore, when etalon 220 is configured based on a target frequency corresponding to reference number 420, the observed frequency of laser beams in dual-channel wavelength locker 200 is unlikely to deviate from the range shown by reference number 440. This is advantageous because dual-channel wavelength locker 200 does not need to be configured to differentiate between equivalent transmission value/reference value ratios (e.g., a ratio corresponding to a frequency to the left of the point shown by reference number 430 and a ratio corresponding to a frequency to the right of the point shown by reference number 430), thus simplifying implementation of dual-channel wavelength locker 200.

In some implementations, dual-channel wavelength locker 200 may measure multiple transmission values for a particular laser beam. For example, as described above, a ratio at reference number 430 may provide a less accurate wavelength estimate than a ratio at reference number 420. To improve accuracy of the wavelength estimate, dual-channel wavelength locker 200 may split the particular laser beam into two laser beams and may cause the two laser beams to take different optical paths through etalon 220.

Based on the different optical paths, the filtered laser beams may have different optical powers, corresponding to different relationships between transmission current and frequency. As one possible example, the relationship shown in FIG. 4 may be shifted in frequency by approximately 25 GHz for one of the two laser beams. When one of the two laser beams is associated with a transmission value/reference value ratio located near reference number 430, dual-channel wavelength locker 200 may estimate the wavelength using the transmission value/reference value ratio for the other of the two laser beams, which is likely to be located near reference number 420. In this way, dual-channel wavelength locker 200 improves accuracy of wavelength measurements for the particular laser beam.

As indicated above, FIG. 4 is provided merely as an example. Other examples are possible and may differ from what was described with regard to FIG. 4.

In this way, a dual-channel wavelength locker controls a wavelength of two laser beams by combining the two laser beams into a combined laser beam. By combining the laser beams, the dual-channel wavelength locker can use shared components to wavelength lock two laser beams, which reduces size and expense of the dual-channel wavelength locker. Furthermore, after combining the two laser beams, the dual-channel wavelength locker can output the two laser beams with spatial and/or angular separation, which simplifies implementation of an output component that receives the two laser beams, such as a dual pigtail.

While implementations described herein are described with regard to wavelength locking two laser beams, implementations described herein are not limited to wavelength locking of two laser beams. Rather, implementations described herein may be used to perform polarization-based wavelength locking for any number of laser beams (e.g., three laser beams, four laser beams, five laser beams, etc.).

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:
1. An optical device, comprising:
   a dual laser emitter to generate a first laser beam and a second laser beam,
      the first laser beam and the second laser beam to be associated with orthogonal polarization states;
   a first photodetector and a second photodetector to generate respective first currents based on optical powers of the first laser beam and the second laser beam, the first currents to be used to control wavelengths at which the first laser beam and the second laser beam are to be generated;
a polarization-based beam splitter to combine the first laser beam and the second laser beam based on the orthogonal polarization states;
a wavelength filter to filter the first laser beam and the second laser beam based on respective wavelengths of the first laser beam and the second laser beam; and
a third photodetector and a fourth photodetector to generate respective second currents,
the third photodetector and the fourth photodetector to generate the respective second currents based on optical powers of the first laser beam and the second laser beam after the first laser beam and the second laser beam are filtered by the wavelength filter,
the wavelengths of the first laser beam and the second laser beam to be controlled based on the first currents and the second currents.

2. The optical device of claim 1, where the second laser beam that is combined with the first laser beam is a first portion of the second laser beam; and
where the optical device further comprises:
a beam splitter to receive the second laser beam and split the second laser beam into the first portion and a second portion,
the second portion to be received by the second photodetector,
the second photodetector to generate the first current corresponding to the second laser beam based on an optical power of the second portion.

3. The optical device of claim 1, where the wavelength filter comprises at least one of:
an interferometer,
a Michelson interferometer,
a Fabry-Perot interferometer, or
a Fabry-Perot etalon.

4. The optical device of claim 1, further comprising:
a crystal wedge to impart a spatial separation or an angular separation between the first laser beam and the second laser beam before the first laser beam and the second laser beam are to be outputted by the optical device.

5. The optical device of claim 1, further comprising:
a waveplate to cause the first laser beam or the second laser beam to be polarized to cause the first laser beam and the second laser beam to have the orthogonal polarization states.

6. The optical device of claim 5, where the dual laser emitter comprises a first laser emitter and a second laser emitter,
the first laser emitter being a different laser emitter than the second laser emitter.

7. The optical device of claim 1, further comprising:
an output component to output the first laser beam and the second laser beam with a spatial separation or an angular separation.

8. A method, comprising:
receiving or generating a first laser beam and a second laser beam at orthogonal polarization states;
determining respective reference values for respective first portions of the first laser beam and the second laser beam,
the reference values being determined based on respective optical powers of the first portions;
combining second portions of the first laser beam and the second laser beam to form a third laser beam;
wavelength filtering the third laser beam to form a filtered laser beam,
the filtered laser beam including filtered second portions of the first laser beam and the second laser beam, respectively;
determining respective transmission values of the first laser beam and the second laser beam based on respective optical powers of the filtered second portions; and
controlling wavelengths of the first laser beam and the second laser beam based on the reference values and the transmission values.

9. The method of claim 8, where generating the first laser beam and the second laser beam at the orthogonal polarization states comprises:
generating the first laser beam and the second laser beam at a same polarization state; and
changing a polarization state of the first laser beam or the second laser beam to cause the first laser beam and the second laser beam to have the orthogonal polarization states.

10. The method of claim 8, where wavelength filtering the third laser beam comprises:
transmitting the third laser beam through one of:
an interferometer,
a Michelson interferometer,
a Fabry-Perot interferometer, or
a Fabry-Perot etalon.

11. The method of claim 8, where determining the respective transmission values comprises:
directing the second portion of the first laser beam to a first photodetector based on a polarization state of the first laser beam,
the first photodetector generating a current based on which the transmission value for the first laser beam is determined; and
directing the second portion of the second laser beam to a second photodetector based on a polarization state of the second laser beam,
the second photodetector generating a current based on which the transmission value for the second laser beam is determined.

12. The method of claim 8, where one or more of the reference values are determined after the second portions of the first laser beam and the second laser beam are combined to form the third laser beam.

13. The method of claim 8, where determining the reference values comprises:
splitting the first laser beam, before the first laser beam and the second laser beam are combined, to cause the first portion of the first laser beam to be transmitted to a photodetector,
the photodetector generating a current based on the optical power of the first portion of the first laser beam,
the reference value being determined based on the current.

14. The method of claim 8, where controlling the wavelengths comprises:
controlling the wavelength of the first laser beam based on a ratio of the reference value for the first laser beam to the transmission value for the first laser beam; and
controlling the wavelength of the second laser beam based on a ratio of the reference value for the second laser beam to the transmission value for the second laser beam.

15. The method of claim 8, further comprising:
outputting spatially or angularly separated portions of the first laser beam and the second laser beam.

16. An optical device, comprising:
a dual laser emitter to generate a first laser beam and a second laser beam;
first and second photodetectors to generate respective reference values based on respective optical powers of the first laser beam and the second laser beam,
the first photodetector to generate the reference value for a first portion of the first laser beam,
the second photodetector to generate the reference value for a first portion of the second laser beam;
a polarization-based beam splitter to combine the first laser beam and the second laser beam into a combined laser beam based on the first laser beam and the second laser beam having different polarization states;
a wavelength filter to filter at least a portion of the combined laser beam based on wavelengths of the first laser beam and the second laser beam to form a filtered laser beam; and
third and fourth photodetectors to generate transmission values based on respective optical powers of respective second portions of the first laser beam and the second laser beam after the filtered laser beam is formed,
the third photodetector to generate the transmission value for the second portion of the first laser beam,
the fourth photodetector to generate the transmission value for the second portion of the second laser beam, and
the reference values and the transmission values to be used to control the wavelengths of the first laser beam and the second laser beam generated by the dual laser emitter.

17. The optical device of claim 16, where the polarization-based beam splitter is a first polarization-based beam splitter; and
where the optical device further comprises:
a second polarization-based beam splitter to receive the filtered laser beam and to separate the second portion of the first laser beam from the second portion of the second laser beam.

18. The optical device of claim 16, further comprising:
a beam splitter to split the first laser beam into the first portion of the first laser beam and another portion of the first laser beam,
the other portion of the first laser beam to be combined with the second laser beam to form the combined laser beam.

19. The optical device of claim 18, where the beam splitter is a first beam splitter; and
where the optical device further comprises:
a second beam splitter to split the combined laser beam into the portion of the combined laser beam and another portion of the combined laser beam,
the other portion of the combined laser beam to include the second portion of the second laser beam, and
the other portion of the combined laser beam to be transmitted to one of the first photodetector or the second photodetector.

20. The optical device of claim 16, further comprising at least one of:
an isolator to receive the first laser beam or the second laser beam, or
a crystal wedge to receive the combined laser beam and to cause a third portion of the first laser beam and a third portion of the second laser beam to be outputted with an angular separation or a spatial separation.

* * * * *